United States Patent
Hibino et al.

(10) Patent No.: US 9,001,503 B1
(45) Date of Patent: Apr. 7, 2015

(54) ELECTRONIC APPARATUS

(71) Applicant: KYOCERA Corporation, Kyoto-shi, Kyoto (JP)

(72) Inventors: Kouta Hibino, Shijonawate (JP); Hiroyoshi Kawanishi, Sanda (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/463,495

(22) Filed: Aug. 19, 2014

(30) Foreign Application Priority Data

Nov. 27, 2013 (JP) ................... 2013-244696
Jun. 4, 2014 (JP) ................... 2014-115943

(51) Int. Cl.
*H04M 1/00* (2006.01)
*H05K 5/00* (2006.01)
*H05K 7/00* (2006.01)
*H05K 5/03* (2006.01)
*H05K 5/02* (2006.01)

(52) U.S. Cl.
CPC ............... *H05K 5/03* (2013.01); *H05K 5/0217* (2013.01)

(58) Field of Classification Search
None
See application file for complete search history.

(56) References Cited

U.S. PATENT DOCUMENTS

| | | | | |
|---|---|---|---|---|
| 4,366,355 A * | 12/1982 | Oelsch | ......................... | 200/517 |
| 4,500,758 A * | 2/1985 | Guckenheimer | ............. | 200/5 A |
| 6,169,256 B1 * | 1/2001 | Hanahara et al. | ............. | 200/5 A |
| 6,876,837 B2 * | 4/2005 | Kuroshima et al. | ........... | 455/90.3 |
| 7,115,827 B2 * | 10/2006 | Tseng | ............................ | 200/341 |
| 7,123,473 B2 * | 10/2006 | Xu | ............................. | 361/679.02 |
| 7,902,474 B2 * | 3/2011 | Mittleman et al. | ............ | 200/516 |
| 8,367,958 B2 * | 2/2013 | Mittleman et al. | ............ | 200/516 |
| 8,432,678 B2 * | 4/2013 | McClure et al. | ........... | 361/679.3 |
| 8,586,884 B2 * | 11/2013 | Voli et al. | ...................... | 200/5 A |
| 8,738,104 B2 * | 5/2014 | Yeates | ........................ | 455/575.8 |
| 2004/0182687 A1 * | 9/2004 | Tsubaki | ......................... | 200/341 |
| 2005/0237737 A1 * | 10/2005 | Kim | .............................. | 362/197 |
| 2006/0283691 A1 * | 12/2006 | Chang et al. | .................. | 200/5 A |
| 2008/0237023 A1 * | 10/2008 | Kazama | ........................ | 200/6 A |
| 2009/0236206 A1 * | 9/2009 | Wennemer et al. | ......... | 200/302.2 |
| 2009/0273570 A1 * | 11/2009 | Degner et al. | .................. | 345/173 |
| 2011/0038115 A1 * | 2/2011 | Halkosaari | ............... | 361/679.08 |
| 2011/0069437 A1 * | 3/2011 | Hamel et al. | ............. | 361/679.02 |
| 2011/0255260 A1 * | 10/2011 | Weber et al. | .................. | 361/807 |
| 2012/0020045 A1 * | 1/2012 | Tanase | ......................... | 361/807 |
| 2012/0147570 A1 * | 6/2012 | Yamazaki | ..................... | 361/748 |
| 2012/0250273 A1 * | 10/2012 | Kuo | ............................. | 361/752 |
| 2013/0236699 A1 | 9/2013 | Prest et al. | | |
| 2013/0328792 A1 | 12/2013 | Myers et al. | | |
| 2014/0023430 A1 | 1/2014 | Prest et al. | | |
| 2014/0030443 A1 | 1/2014 | Prest et al. | | |

FOREIGN PATENT DOCUMENTS

| | | | |
|---|---|---|---|
| JP | 1993333164 A | 12/1993 | |
| JP | 1993335435 A | 12/1993 | |
| JP | 1997008690 A | 1/1997 | |

(Continued)

*Primary Examiner* — Hoa C Nguyen
*Assistant Examiner* — Xanthia C Cunningham
(74) *Attorney, Agent, or Firm* — Procopio, Cory, Hargreaves & Savitch LLP

(57) ABSTRACT

A cover panel made of sapphire is provided on a surface of an electronic apparatus. The cover panel includes a first surface and a second surface opposite to the first surface. An operation button is positioned in a hole provided in the cover panel. A case supports the second surface of the cover panel. The case supports and covers an edge of the hole of the second surface.

10 Claims, 17 Drawing Sheets

(56) References Cited

FOREIGN PATENT DOCUMENTS

| | | |
|---|---|---|
| JP | 2005173393 A | 6/2005 |
| JP | 2008111984 A | 5/2008 |
| JP | 2013131987 A | 7/2013 |
| WO | 02054426 A1 | 7/2002 |
| WO | 02054427 A1 | 7/2002 |
| WO | 02054716 A2 | 7/2002 |
| WO | 02054718 A2 | 7/2002 |
| WO | 02054721 A1 | 7/2002 |
| WO | 02054723 A1 | 7/2002 |
| WO | 02054724 A1 | 7/2002 |
| WO | 02054846 A1 | 7/2002 |

* cited by examiner

ELECTRONIC APPARATUS

CROSS-REFERENCE TO RELATED APPLICATIONS

The present application claims priority under 35 USC §119 to Japanese Patent Application No. 2013-244696 filed on Nov. 27, 2013, entitled "Electronic Apparatus" and Japanese Patent Application No. 2014-115943 filed on Jun. 4, 2014, entitled "Electronic Apparatus", the entirety of which is incorporated herein by reference.

FIELD

The present invention relates to an electronic apparatus, and more particularly to an electronic apparatus including a cover panel.

BACKGROUND

In the related art, various techniques are proposed for providing cover panels for displays of electronic devices. These cover panels are subject to breakage and other damage such as cracking and chipping.

SUMMARY

As disclosed in Japanese Unexamined Patent Application Publication No. 2013-131987, there is an example in which a panel is provided on a surface of the electronic apparatus. It is desirable that such a panel be resistant to breakage.

Accordingly, a technique is provided that makes it possible for a panel provided on a surface of an electronic apparatus to be difficult to be broken.

An electronic apparatus includes a first panel that is provided on a surface of the electronic apparatus, has a layer made of sapphire, and includes a first surface on a surface side of the electronic apparatus, and a second surface on the opposite side to the first surface. An operation button is positioned in a hole provided in the first panel, and a supporting unit supports the second surface of the first panel, in which the supporting unit supports a peripheral portion of the hole of the second surface such that an edge of the hole in the second surface of the first panel is covered.

Accordingly, the first panel provided on the surface of the electronic apparatus becomes resistant to breakage.

DETAILED DESCRIPTION

External Appearance of Electronic Apparatus

Figure 1:
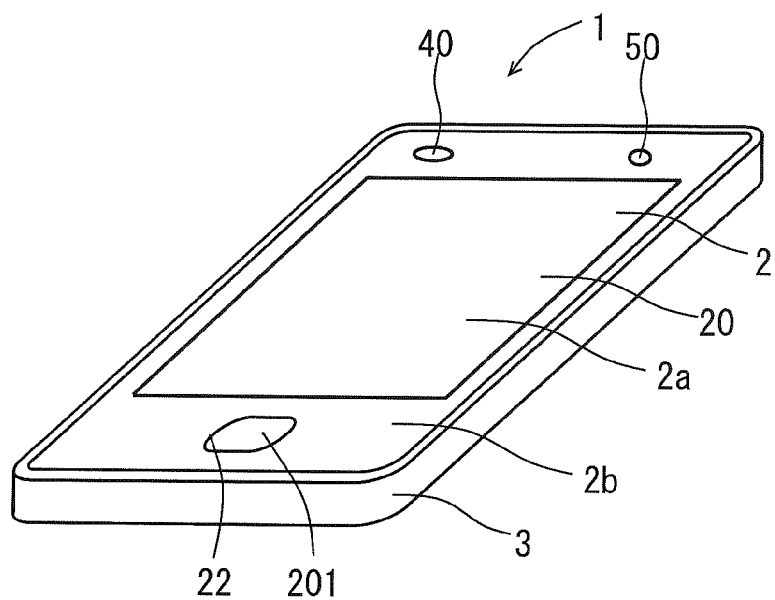
FIG. 1 is a perspective view illustrating an example of the external appearance of an electronic apparatus.
Figure 2:
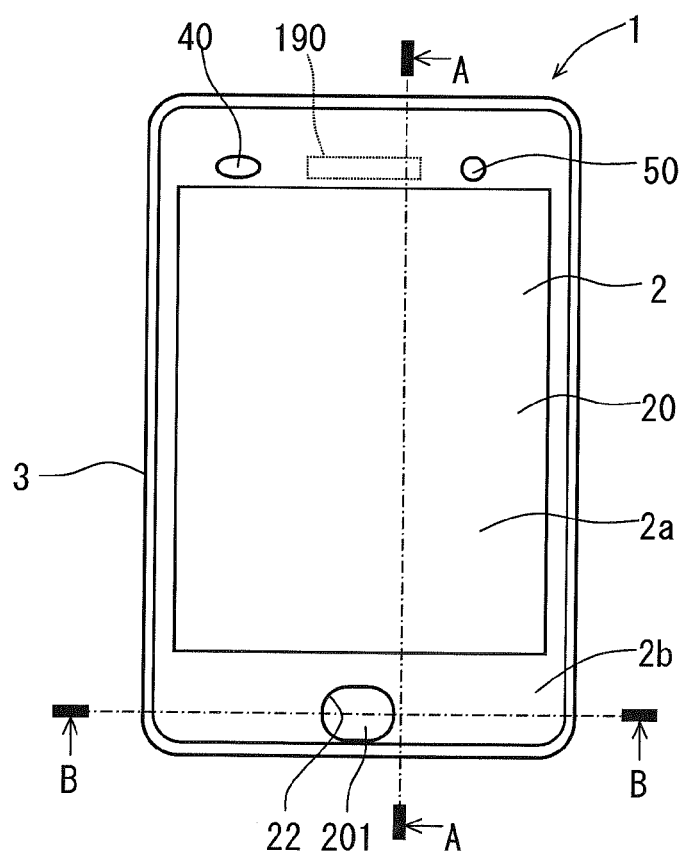
FIG. 2 is a front surface view illustrating an example of the external appearance of the electronic apparatus.
Figure 3:
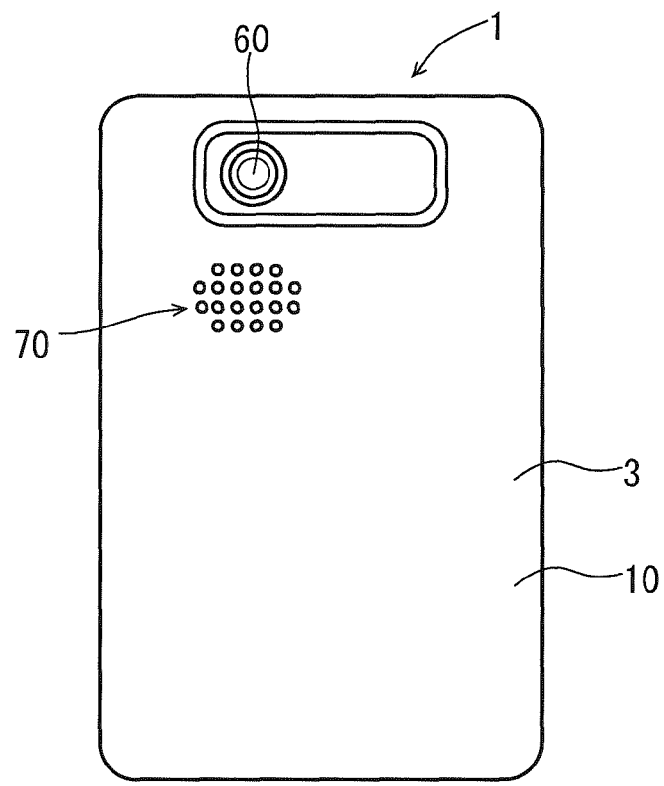
FIG. 3 is a rear surface view illustrating an example of the external appearance of the electronic apparatus.
Figure 4:
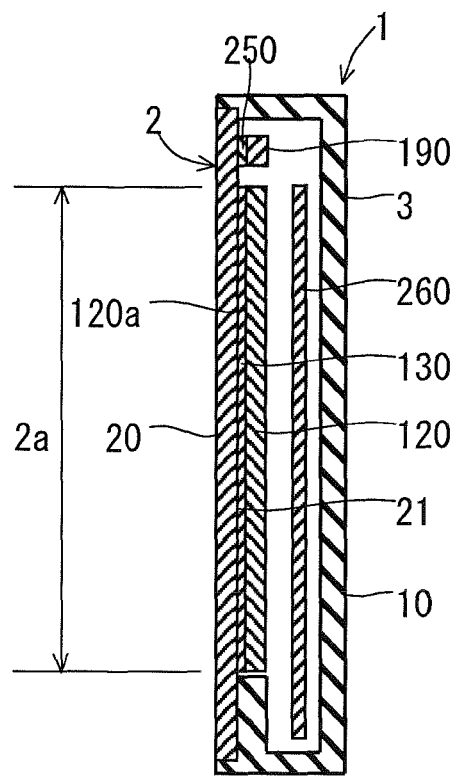
FIG. 4 is a view illustrating an example of a cross-sectional structure of the electronic apparatus.
Figure 5:
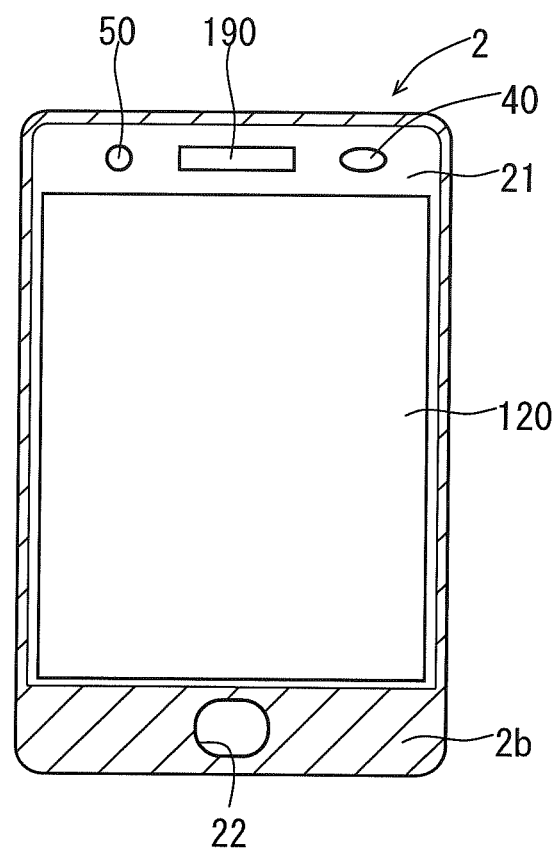
FIG. 5 is a plan view illustrating an example of a cover panel when seen from the inner surface side.

FIGS. 1, 2 and 3 are respectively examples of a perspective view, a front surface view, and a rear surface view illustrating an external appearance of an electronic apparatus 1. FIG. 4 is a view schematically illustrating a cross-sectional structure along line A-A of the electronic apparatus 1 illustrated in FIG. 2. FIG. 5 is a rear surface view of a cover panel 2 included in the electronic apparatus 1. A piezoelectric vibrating element 190 and a display panel 120 included in the electronic apparatus 1 are installed on the cover panel 2 illustrated in FIG. 5. The electronic apparatus 1 is, for example, a mobile phone such as a smart phone.

As illustrated in FIGS. 1 to 4, the shape of the electronic apparatus 1 is approximately a rectangular plate shape in a plan view. The electronic apparatus 1 includes a transparent, and or light transmissive cover panel 2 which covers a display surface 120a (see FIG. 4) of the display panel 120 and a case 3 which supports the cover panel 2.

The cover panel 2 is provided on the surface of the electronic apparatus 1, specifically, on the front surface of the electronic apparatus 1. The cover panel 2 is arranged on a portion other than an edge area, for example a peripheral edge, of the front surface of the electronic apparatus 1.

The cover panel 2 has, for example, a plate shape, and an approximately rectangular shape in a plan view. The cover panel 2 includes a first surface 20 facing outwards from the case 3 and constituting a portion of the front surface of the electronic apparatus 1 and a second surface 21 that is positioned on the opposite side to the first surface 20 and faces the display surface 120a of the display panel 120. Hereinafter, the first surface 20 is also referred to as an "outer surface 20" and the second surface 21 is also referred to as an "inner surface 21." The cover panel 2 may be a plane panel having a planar shape or a curved panel having a curved shape.

The cover panel 2 is made of, for example, sapphire. That is, the cover panel 2 is a panel of a one-layer structure having a layer made of sapphire which is provided on the surface of the electronic apparatus 1. Here, sapphire refers to a single crystal containing alumina ($Al_2O_3$) as a main component, and a single crystal whose purity of $Al_2O_3$ is approximately greater than or equal to 90% in the present specification. The purity of $Al_2O_3$ is preferably greater than or equal to 99%, which provides a resistance to damage of the cover panel and a reduction of cracks or chipping.

In an embodiment, the cover panel 2 is a one-layer structure made of sapphire which is provided on the surface of the electronic apparatus 1, but the cover panel 2 may be a composite panel (laminated panel) of a multilayer structure. For example, the cover panel 2 may be a composite panel of a two-layered structure configured of a first layer (sapphire panel) made of sapphire which is provided on the surface of the electronic apparatus 1 and a second layer (glass panel) made of glass which is attached to the first layer. In addition, the cover panel 2 may be a composite panel of a three-layered structure configured of a layer (sapphire panel) made of sapphire which is provided on the surface of the electronic apparatus 1, a layer (glass panel) made of glass which is attached to the layer made of sapphire, and a layer (sapphire panel) made of sapphire which is attached to the layer made of glass. Further, the cover panel 2 may include a layer made of crystalline materials other than sapphire such as diamond, zirconia, titania, crystal, lithium tantalate, and aluminum oxynitride.

The cover panel 2 is provided with a transparent and/or light transmissive display portion 2a (also referred to as a display window) transmitting the display of the display panel 120. The display portion 2a has, for example, a rectangular shape in a plan view. The visible light output from the display panel 120 passes through the display portion 2a and is extracted to the outside of the electronic apparatus 1. A user visually recognizes information displayed on the display panel 120 through the display portion 2a from the outside of the electronic apparatus 1.

A portion of a peripheral end 2b that surrounds the display portion 2a in the cover panel 2 is black, that is, opaque or semi-opaque, because of, for example, a film that is attached thereto. Accordingly, the portion of the peripheral end 2b is a non-display portion that does not transmit the display of the display panel 120.

The case 3 has an approximately square shape with one surface that is partially opened. The case 3 of the electronic apparatus 1 includes a peripheral end of a front surface, a side surface, and a rear surface. The case 3 is formed of, for example, at least one of a resin and a metal. The resin forming the case 3 may be, for example, a polycarbonate resin, an ABS resin, or a nylon-based resin. A metal forming the case 3 may be, for example, aluminum. The case 3 may be configured of only one material member or a combination of materials.

As illustrated in FIG. 4, a touch panel 130 is attached to the inner surface 21 of the cover panel 2. In addition, the display panel 120, which is a display unit, is attached to the surface on the opposite side of the touch panel 130. That is, the display panel 120 is installed on the inner surface 21 of the cover panel 2 with the touch panel 130 there between. A portion of the cover plate 2 facing the display panel 120 becomes the display portion 2a. The user can program various instructions with respect to the electronic apparatus 1 by operating the display portion 2a of the cover panel 2 using a finger or the like. The touch panel 130 is light transmissive and may include one or more solar cells.

A printed board 260, on which various components such as a CPU 101, a DSP 102, and the like described below are mounted, is provided in the inside of the case 3. The printed board 260 is disposed between a rear surface 10 side of the electronic apparatus 1 and the display panel 120.

An operation unit 200, described below and illustrated in FIG. 6, includes a user interface component such as an operation button 201 that is disposed in the inside of the case 3. The surface of the operation button 201 is exposed from the lower end of the outer surface 20 of the cover panel 2. A hole (for example, a through-hole) 22 that penetrates the cover panel 2 in the thickness direction thereof is provided in the lower end of the cover panel 2. The hole 22 is provided on the central portion in the lateral direction in the lower end of the cover panel 2. The operation button 201 is exposed from the hole 22. Although one operation button 201 is shown with respect to the operation unit 200, a plurality of the operation buttons 201 exposed from the cover panel 2 may be provided.

The operation button 201 may be, for example, glass or resin. Other materials that may be used for the operation button 201 include crystalline materials such as sapphire, diamond, zirconia, titania, crystal, lithium tantalate, and aluminum oxynitride.

Figure 6:
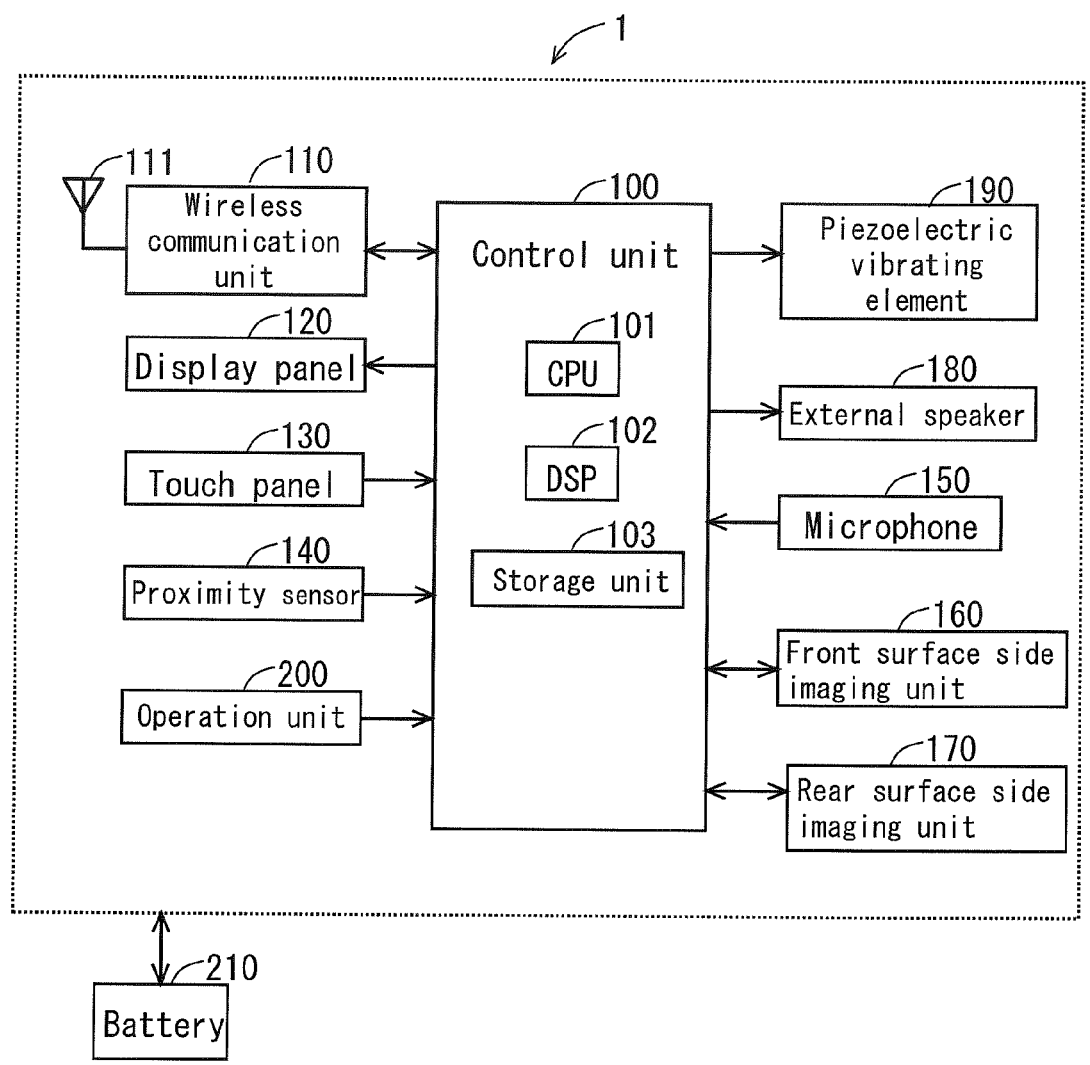
FIG. 6 is a view illustrating an example of an electrical configuration of the electronic apparatus.

As illustrated in FIG. 4 and FIG. 6, a proximity sensor 140, a front surface side imaging unit 160, a rear surface side imaging unit 170, and a piezoelectric vibrating element 190 are provided in the inside of the case 3. As illustrated in FIG. 4, the piezoelectric vibrating element 190 is attached to the inner surface 21 of the cover panel 2 by an attaching member 250. For example, a double-sided tape or an adhesive is adopted as an attaching member 250.

A transparent portion 40 for a proximity sensor for visual recognition of the proximity sensor 140 is disposed in the upper end of the cover panel 2. In addition, a transparent portion 50 for a front surface lens for visual recognition of an imaging lens is included in the front surface side imaging unit 160, and is disposed on the upper end of the cover panel 2.

As illustrated in FIG. 3, a transparent portion 60 for a rear surface lens for visual recognition of the imaging lens, which is included in the rear surface side imaging unit 170, is disposed on the rear surface 10 of the electronic apparatus 1. Speaker holes 70 are formed on the rear surface 10 of the electronic apparatus 1.

The cover panel 2 is attached to the case 3 by an attaching member. Specifically, the inner surface 21 of the cover panel 2 is attached to the case 3 through the attaching member. In this manner, the inner surface 21 of the cover panel 2 is supported by the case 3.

In FIG. 5, an area attached to the case 3 by the attaching member in the inner surface 21 of the cover panel 2 is indicated by oblique lines. As illustrated in FIG. 1 and FIG. 5, the case 3 is attached to the peripheral edge on the inner surface 21 of the cover panel 2 such that the case 3 surrounds the entire circumference of the display portion 2a of the cover panel 2. That is, the case 3 supports the peripheral edge on the inner surface 21 of the cover panel 2 such that the case 3 surrounds the circumference of the display portion 2a of the cover panel 2.

In the upper end on the inner surface 21 of the cover panel 2, a portion on the upper side (outer side) of the transparent portion 40 for a proximity sensor and the transparent portion 50 is attached to the case 3. In contrast, in the lower end on the inner surface 21 of the cover panel 2, a large part of the area on the lower side of the display portion 2a is attached to the case 3.

<Electrical Configuration of Electronic Apparatus>

FIG. 6 is a block diagram mainly illustrating the electrical configuration of the electronic apparatus 1. As illustrated in FIG. 6, the electronic apparatus 1 includes the control unit 100, a wireless communication unit 110, the display panel 120, the touch panel 130, the proximity sensor 140, and a microphone 150. Further, the electronic apparatus 1 includes the front imaging unit 160, the rear imaging unit 170, an external speaker 180, the piezoelectric vibrating element 190, the operation unit 200, and the battery 210. These elements are accommodated in the case 3.

The control unit 100 includes a Central Processing Unit (CPU) 101, a Digital Signal Processor (DSP) 102, and a storage unit 103. The control unit 100 manages the overall operation of the electronic apparatus 1 by controlling other elements of the electronic apparatus 1.

The storage unit 103 is a recording medium which is non-transitory and is readable by the control unit 100 (CPU 101 and DSP 102) such as a Read Only Memory (ROM) and a Random Access Memory (RAM). A main program, a plurality of application programs, and the like, which are control programs for controlling the electronic apparatus 1, specifically, for controlling respective elements such as the wireless communication unit 110, the display panel 120, and the like, are stored in the storage unit 103. Various functions of the control unit 100 can be realized by the CPU 101 and the DSP 102 executing various programs in the storage unit 103.

Further, in addition to the ROM and the RAM, the storage unit 103 may include a non-transitory recording medium which is readable by a computer. The storage unit 103 may include a compact hard disk drive and a Solid State Drive (SSD).

The wireless communication unit 110 includes an antenna 111. In the wireless communication unit 110, the antenna 111 receives a signal from a mobile phone different from the electronic apparatus 1, or from a communication device such as a web server connected to the Internet via a base station. The wireless communication unit 110 performs an amplification process and down conversion on the received signal and outputs the signal to the control unit 100. The control unit 100 performs demodulation processing or the like on the received signal, and acquires a sound signal (sound information) indicating a voice or music included in the received signal.

Further, the wireless communication unit 110 performs up-converting and an amplification process on a transmission signal, which may include a sound signal or the like, generated in the control unit 100, and transmits the transmission signal through the antenna 111 in a wireless manner. The transmission signal from the antenna 111 is received by a communication device connected to the Internet, or is received by a mobile phone different from the electronic apparatus 1 via a base station.

The display panel 120 is, for example, a liquid crystal display panel or an organic electro luminescent (EL) panel. The display panel 120 displays various pieces of information such as characters, symbols, and figures by control of the control unit 100. The information displayed in the display panel 120 can be visually recognized by the user of the electronic apparatus 1 through the display portion 2a of the cover panel 2.

The touch panel 130 is, for example, a projection type electrostatic capacitance touch panel in a form of a sheet. The touch panel 130 detects contact of an object with respect to the display portion 2a of the cover panel 2 and outputs a detection signal according to the detected contact. The touch panel 130 is attached to the inner surface 21 of the cover panel 2. The control unit 100 specifies the contents of an operation performed on the display portion 2a of the cover panel 2 based on the detection signal output from the touch panel 130, and performs an operation according to the specified contents.

The proximity sensor 140 is, for example, an infrared type proximity sensor. The proximity sensor 140 outputs a detection signal when an object approaches the proximity sensor 140 within a predetermined distance. The detection signal is input to the control unit 100. When the control unit 100 receives the detection signal from the proximity sensor 140, for example, the control unit 100 stops a function of detecting an operation of the touch panel 130.

The front imaging unit 160 includes an imaging lens, an imaging element, and the like. The front imaging unit 160 images a still image and a moving image based on the control by the control unit 100. The imaging lens of the front imaging unit 160 can be visually recognized from the second transparent portion 50 on the front surface of the electronic apparatus 1. Therefore, the front imaging unit 160 can image an object in front of the surface side (cover panel 2 side) of the electronic apparatus 1.

The rear surface imaging unit 170 includes an imaging lens, an imaging element, and the like. The rear imaging unit 170 images a still image and a moving image based on the control by the control unit 100. The imaging lens of the rear imaging unit 170 can be recognized from the third transparent portion 60 on the rear surface of the electronic apparatus 1. Therefore, the rear surface 10 side imaging unit 170 can image an object in front of the rear surface 10 side of the electronic apparatus 1.

The microphone 150 outputs a sound from the outside of the electronic apparatus 1 to the control unit 100 by converting the sound into an electric sound signal. The sound from the outside of the electronic apparatus 1 is received by the microphone 150 through microphone holes (not illustrated) configured on the surface of the electronic apparatus 1.

The external speaker 180 is, for example, a dynamic speaker. The external speaker 180 converts the electric sound signal from the control unit 100 into a sound and then outputs the sound. The sound output from the external speaker 180 is output from the speaker holes 70 configured on the rear surface 10 of the electronic apparatus 1. The volume of the sound output from the speaker holes 70 is set to a degree such that the sound can be heard at a location separated from the electronic apparatus 1.

As illustrated in FIG. 4 and FIG. 6, the piezoelectric vibrating element 190 is attached to the inner surface 21 of the cover panel 2 disposed on the front surface of the electronic apparatus 1 by and attaching member 250 as described above. The piezoelectric vibrating element 190 is vibrated by a driving voltage applied from the control unit 100. The control unit 100 generates a driving voltage based on a sound signal and applies the driving voltage to the piezoelectric vibrating element 190. The cover panel 2 is vibrated by the piezoelectric vibrating element 190 which vibrates based on the driving voltage form the control unit 100. As a result, a reception sound is transmitted to the user from the cover panel 2. The volume of the reception sound is set to a degree such that the user can appropriately hear the sound when the cover panel 2 is set close against an ear of the user.

The operation unit 200 includes an operation button 201 and a switch, and detects an operation with respect to the operation button 201. The switch turns on when the operation button 201 is pressed (operated). The operation unit 200 outputs an ON signal, indicating that the operation button 201 is operated, to the control unit 100 when the switch is turned on. In contrast, the operation unit 200 outputs an OFF signal, indicating that the operation button 201 is not operated, to the control unit 100 when the operation button 201 has not operated for a predetermined time and the switch is turned OFF. The control unit 100 determines whether the operation button 201 is operated or not based on the ON signal and the OFF signal input from the operation unit 200, and performs an operation according to the determination result.

The battery 210 outputs a power source for use by the electronic apparatus 1. The power source output from the battery 210 is supplied to respective electronic components contained in the control unit 100 or the wireless communication unit 110 included in the electronic apparatus 1.

<Details of Piezoelectric Vibrating Element>

Figure 7:
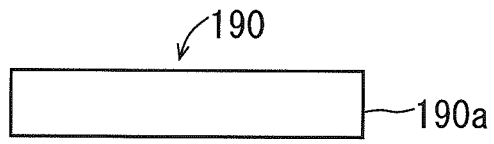
FIG. 7 is a top view illustrating an example of a configuration of a piezoelectric vibrating element.
Figure 8:
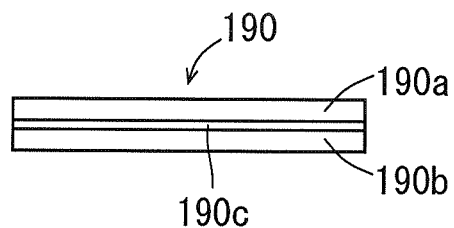
FIG. 8 is a side surface view illustrating an example of the configuration of the piezoelectric vibrating element.

FIGS. 7 and 8 illustrate a top view and a side view, respectively, of a structure of the piezoelectric vibrating element 190. As illustrated in FIGS. 7 and 8, the piezoelectric vibrating element 190 has a long shape in one direction. Specifically, the piezoelectric vibrating element 190 has a long and narrow rectangular plate shape in a plan view. The piezoelectric vibrating element 190 has, for example, a bimorph structure. The piezoelectric vibrating element 190 includes a first piezoelectric ceramic plate 190a and a second piezoelectric ceramic plate 190b which are bonded to each other through a shim material 190c.

In the piezoelectric vibrating element 190, when a positive voltage is applied to the first piezoelectric ceramic plate 190a and a negative voltage is applied to the second piezoelectric ceramic plate 190b, the first piezoelectric ceramic plate 190a extends along the longitudinal direction and the second piezoelectric ceramic plate 190b contracts along the longitudinal direction. Accordingly, as illustrated in FIG. 9, the piezoelectric vibrating element 190 is bent into a convex shape with the first piezoelectric ceramic plate 190a being outside.

In contrast, in the piezoelectric vibrating element 190, when a negative voltage is applied to the first piezoelectric ceramic plate 190a and a positive voltage is applied to the second piezoelectric ceramic plate 190b, the first piezoelectric ceramic plate 190a contracts along the longitudinal direction and the second piezoelectric ceramic plate 190b extends along the longitudinal direction. Accordingly, as illustrated in FIG. 10, the piezoelectric vibrating element 190 is bent into a convex shape with the second piezoelectric ceramic plate 190b being outside.

Figure 9:
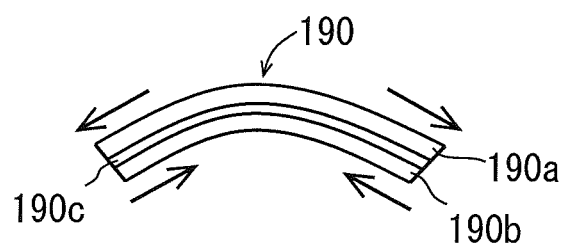
FIG. 9 is a view illustrating an example of a state of the piezoelectric vibrating element being bent and vibrating.
Figure 10:
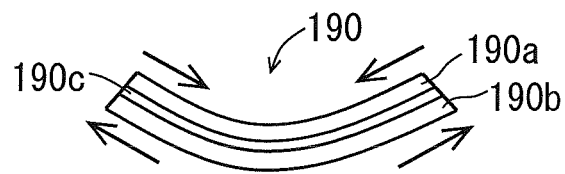
FIG. 10 is a view illustrating an example of the state of the piezoelectric vibrating element being bent and vibrating.

The piezoelectric vibrating element 190 vibrates while being bent along the longitudinal direction by alternatively taking the state of FIG. 9 and FIG. 10. The control unit 100 allows the piezoelectric vibrating element 190 to vibrate while being bent along the longitudinal direction by applying an alternating current (AC) voltage in which the positive voltage and the negative voltage alternatively appear at an area between the first piezoelectric ceramic plate 190a and the second piezoelectric ceramic plate 190b.

Only one structure made of the first piezoelectric ceramic plate 190a and the second piezoelectric ceramic plate 190b, which are bonded to each other by interposing the shim material 190c there between, is provided in the piezoelectric vibrating element 190 illustrated in FIGS. 7 to 10. However, a plurality of the structures may be laminated to each other.

The piezoelectric vibrating element 190 having such a structure is disposed on the peripheral end of the inner surface 21 of the cover panel 2, as illustrated in FIG. 5. Specifically, the piezoelectric vibrating element 190 is disposed in a central portion in a short-length direction in the upper end of the inner surface 21 of the cover panel 2. The longitudinal direction of the piezoelectric vibrating element 190 is disposed along the short-length direction of the cover panel 2. In this manner, the piezoelectric vibrating element 190 vibrates while being bent along the short-length direction of the cover panel 2. Further, the center of the longitudinal direction of the piezoelectric vibrating element 190 corresponds to the center of the short-length direction in the upper end of the inner surface 21 of the cover panel 2.

As illustrated in FIGS. 9 and 10, the center of the longitudinal direction of the piezoelectric vibrating element 190 has the largest displacement amount when the piezoelectric vibrating element 190 is vibrating. Accordingly, an area in the center of the short-length direction in the upper end of the inner surface 21 of the cover panel 2, that corresponds to the position of the piezoelectric vibrating element, has the largest displacement amount of bending and vibrating.

As illustrated in FIG. 7 to FIG. 10, only one structure made of the first piezoelectric ceramic plate 190a and the second piezoelectric ceramic plate 190b, which are bonded to each other by interposing the shim material 190c there between, is provided in the piezoelectric vibrating element 190. However, a plurality of the structures may be laminated to each other. For example, twenty-eight or more layers that are laminated provide an increased level of vibration that can be transmitted to the cover panel 2. Accordingly, forty-four or more layers that are laminated provide an increased sufficiency in the vibration that can be transmitted to the cover panel 2.

Further, the piezoelectric vibrating element 190 may be made of organic piezoelectric materials such as polyvinylidene fluoride and polylactic acid in addition to the piezoelectric ceramic materials. For example, the piezoelectric vibrating element 190 is configured such that films made of polylactic acid are used as a first piezoelectric plate and a second piezoelectric plate and they are laminated to each other. In addition, in regard to an electrode, a transparent electrode such as Indium-Tin-Oxide (that is, indium tin oxide, ITO) is possible to be used.

<Regarding Generation of Reception Sound>

In the electronic apparatus 1, an air conduction sound and a conduction sound are transmitted to the user by the piezoelectric vibrating element 190 through the cover panel 2 which is vibrated by the piezoelectric vibrating element 190.

That is, the vibration of the piezoelectric vibrating element 190 is transmitted to the cover panel 2 so that the air conduction sound and the conduction sound are transmitted to the user from the cover panel 2.

Here, the term "air conduction sound" means a sound recognized in a human brain by the vibration of an eardrum due to a sound wave (air vibration) which enters an external auditory meatus hole (a so-called "ear hole"). On the other hand, the term "conduction sound" is a sound recognized in a human brain by the vibration of the eardrum due to the vibration of an auricle transmitted to the eardrum. Hereinafter, the air conduction sound and the conduction sound will be described in detail.

Figure 11:
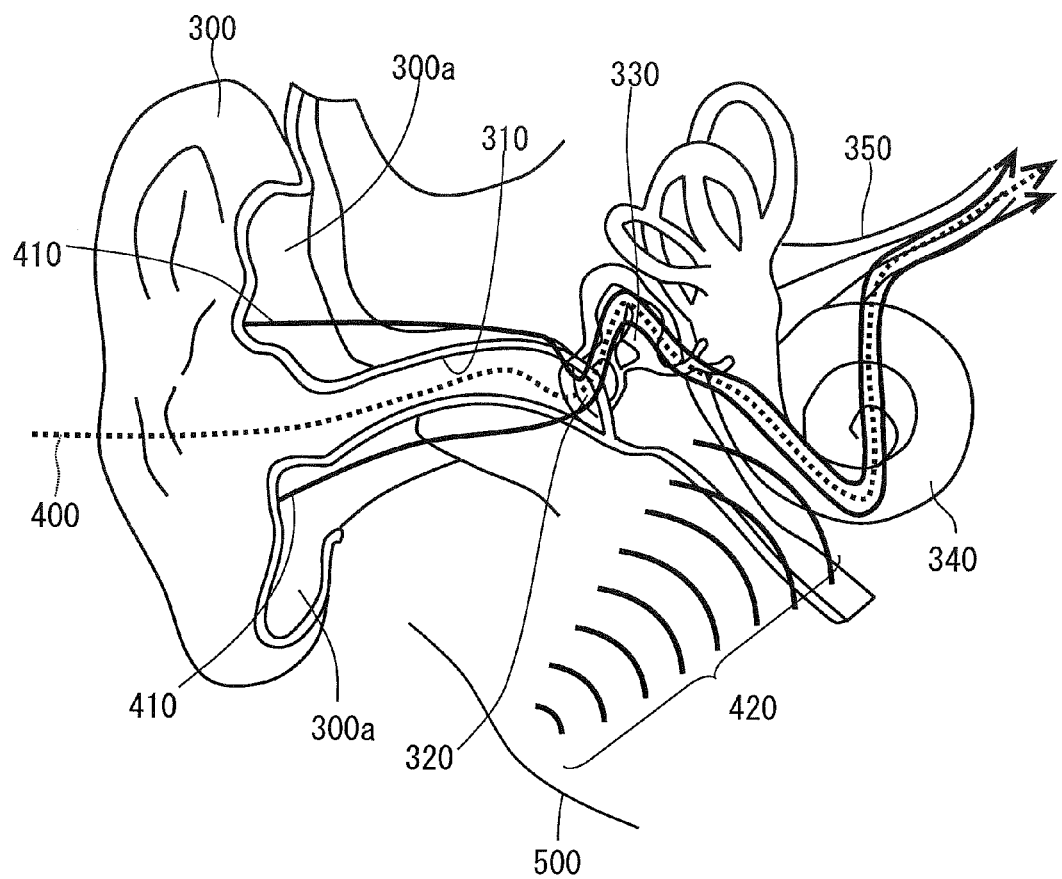
FIG. 11 is a view for describing an example of an air conduction sound and a conduction sound.

FIG. 11 is a view for describing the air conduction sound and the conduction sound. FIG. 11 illustrates a structure of an ear of the user of the electronic apparatus 1. In FIG. 11, a dotted line 400 indicates a conduction path of a sound signal (sound information) of the air conduction sound. A solid line 410 indicates the conduction path of the sound signal of the conduction sound.

When the piezoelectric vibrating element 190 mounted on the cover panel 2 vibrates based on the electric sound signal indicating the reception sound, the cover panel 2 vibrates, and a sound wave is output from the cover panel 2. When the user moves the cover panel 2 of the electronic apparatus 1 close to an auricle 300 of the user by holding the electronic apparatus 1 in a hand, or the cover panel 2 of the electronic apparatus 1 is set to (brought into contact with) the auricle 300 of the user, the sound wave output from the cover panel 2 enters an external auditory meatus hole 310. The sound wave from the cover panel 2 enters in the external auditory meatus hole 310 and the eardrum 320, and the eardrum 320 vibrates. The vibration of the eardrum 320 is transmitted to an auditory ossicle 330 and the auditory ossicle 330 vibrates. In addition, the vibration of the auditory ossicle 330 is transmitted to a cochlea 340 and is converted into an electrical signal in the cochlea 340. The electrical signal is transmitted to the brain by passing through an acoustic nerve 350 and the reception sound is recognized in the brain. In this manner, the air conduction sound is transmitted from the cover panel 2 to the user.

Further, when the user puts the cover panel 2 of the electronic apparatus 1 to the auricle 300 of the user by holding the electronic apparatus 1 in a hand, the auricle 300 is vibrated by the cover panel 2, which cover panel 2 is vibrated by the piezoelectric vibrating element 190. The vibration of the auricle 300 is transmitted to the eardrum 320, and thus the eardrum 320 vibrates. The vibration of the eardrum 320 is transmitted to the auditory ossicle 330, and thus the auditory ossicle 330 vibrates. The vibration of the auditory ossicle 330 is transmitted to the cochlea 340 and is converted into an electrical signal in the cochlea 340. The electrical signal is transmitted to the brain by passing through the acoustic nerve 350 and the reception sound is recognized in the brain. In this manner, the conduction sound is transmitted from the cover panel 2 to the user. FIG. 11 illustrates an auricular cartilage 300a in the inside of the auricle 300.

Bone conduction sound is a sound recognized in a human brain by the vibration of the skull and direct stimulation of the inner ear such as the cochlea caused by the vibration of the skull. In FIG. 11, in a case of vibrating the jawbone 500, the transmission path of the sound signal while the bone conduction sound is recognized in the brain is indicated with a plurality of arcs 420.

As described above, the air conduction sound and the conduction sound can be transmitted from the cover panel 2 to the user of the electronic apparatus 1 due to the vibration of the cover panel 2 through the vibration of the piezoelectric vibrating element 190. The user can hear the air conduction sound from the cover panel 2 by moving the cover panel 2 close to an ear (auricle). Further, the user can hear the air conduction sound and the conduction sound from the cover panel 2 by bringing the cover panel 2 into contact with an ear (auricle).

Since the user can hear a sound when the user puts the cover panel 2 to an ear, communication using the electronic apparatus 1 can be performed without much concern regarding the position of the electronic apparatus 1 with respect to the ear.

In addition, since the user can hear the conduction sound due to the vibration of the auricle, it easy for the user to hear the sound even when there is a large amount of ambient noise. Accordingly, the user can appropriately perform communication even when there is a large amount of the ambient noise.

In addition, even in a state in which earplugs or earphones are fixed to the ears of the user, the reception sound from the electronic apparatus 1 can be recognized by setting the cover panel 2 to the auricle. Further, even in the state in which headphones are fixed to the ears of the user, the reception sound from the electronic apparatus 1 can be recognized by putting the cover panel 2 to the headphones.

The sound from the cover panel 2 becomes easy to hear when the user moves the upper end of the cover panel (particularly, the central portion of the upper end in the short-length direction which corresponds to the placement of the piezoelectric vibrating element 190) close to an ear, or puts the upper end thereof to an ear.

In another example, a general dynamic receiver may be provided instead of or in addition to the piezoelectric vibrating element 190.

<Cross-Sectional Structure of Electronic Apparatus in Periphery of Operation Button>

Figure 12:
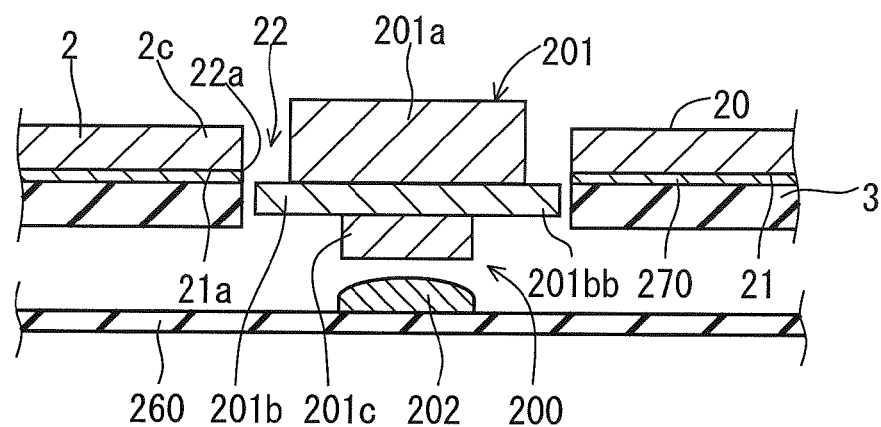
FIG. 12 is a view illustrating an example of a cross-sectional structure on the periphery of an operation button in the electronic apparatus.

FIG. 12 is a view illustrating a cross-sectional structure taken along a line B-B of the electronic apparatus 1 of FIG. 2. As illustrated in FIG. 12, an attaching member 270 attaches the cover panel 2 to the case 3.

As illustrated in FIG. 12, the switch 202, which is included in the operation unit 200, is disposed on the printed board 260. The switch 202 may be disposed on a board different from the printed board 260 on which the CPU 101 is installed.

The operation button 201, which is included in the operation unit 200, is arranged so as to face the switch 202 on the printed board 260. The operation button 201 includes an operation object portion 201a that is operated (pressed) by a user, a pressing portion 201c that presses the switch 202, and a connecting portion 201b that connects the operation object portion 201a with the pressing portion 201c. A peripheral end 201bb of the connecting portion 201b is a flange that projects further outward than the operation object portion 201a and the pressing portion 201c.

The operation object portion 201a projects further outward than an outer surface 20 of the cover panel 2. The connecting portion 201b and the pressing portion 201c are positioned in the inside of an outer surface 20 of the cover panel 2. When the operation object portion 201a is pressed by the user, the pressing portion 201c presses the switch 202. Accordingly, the switch 202 is turned on. The shape of the operation button 201 is not limited to the shape illustrated in FIG. 12.

In one example, the case 3 supporting the inner surface 21 of the cover panel 2 extends to the edge of the hole 22 which is provided in the cover panel 2. The operation button 201 is positioned in the hole 22. That is, the case 3 supports a peripheral portion 21a of the hole 22 in the inner surface 21, and covers an edge 22a (specifically, the entire area of the edge 22a) of the hole 22 in the inner surface 21 of the cover panel 2.

Therefore, the deformation and breakage of the cover panel in an area of the peripheral portion 2c of the hole 22 is reduced.

As described above, since the deformation of the peripheral portion 2c of the hole 22 in the cover panel 2 is reduced, it is possible to reduce the concentration of the stress on the portion 2c. Therefore, even when crystal defects or cracks are included in the peripheral portion 2c of the hole 22, the cleavage of sapphire caused by the crystal defects or cracks is reduced. That is, the breakage of the cover panel 2 is reduced. Accordingly, even when the cover panel 2 is a panel made of a crystal, which is hard to process, such as sapphire, diamond, zirconia, titania, crystal, lithium tantalate, or aluminum oxynitride, the breakage of the cover panel 2 is reduced.

VARIOUS MODIFIED EXAMPLES

Hereinafter, various modified examples of an electronic apparatus 1 are described.

First Modified Example

Figure 13:
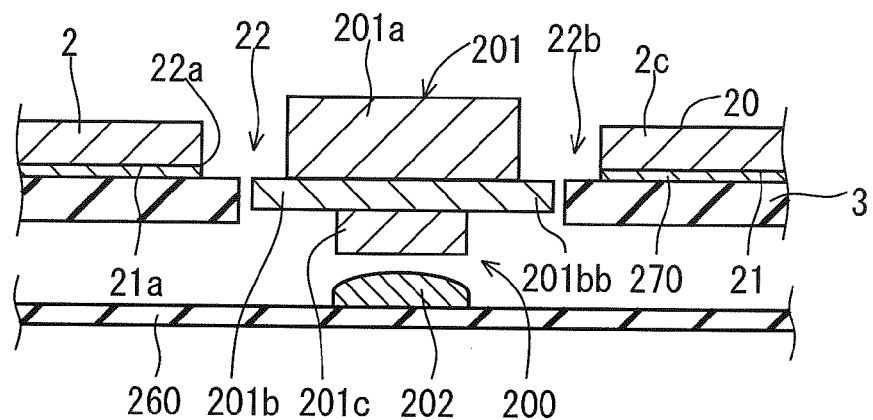
FIG. 13 is a view illustrating an example of the cross-sectional structure on the periphery of the operation button in the electronic apparatus.

In the above example as illustrated in FIG. 12, the case 3 extends to the edge 22a of the hole 22 on the inner surface 21. However, the case 3 may extend to the inside of the hole 22 beyond the edge 22a as illustrated in FIG. 13. That is, the case 3 may support the peripheral portion 21a of the hole 22 in the inner surface 21. In addition, the case 3 covers the edge 22a of the hole 22 in the inner surface 21 of the cover panel 2 of the hole 22a. In this manner, even when a relative positional relationship between the case 3 and the hole 22 provided in the cover panel 2 is shifted in the course of assembling, the case 3 covers the edge 22a of the hole 22 on the inner surface 21. Accordingly, even when the relative positional relationship between the case 3 and the hole 22 provided in the cover panel 2 is shifted, the deformation of the peripheral portion 2c of the hole 22 in the cover panel 2 is reduced.

Second Modified Example

Figure 14:
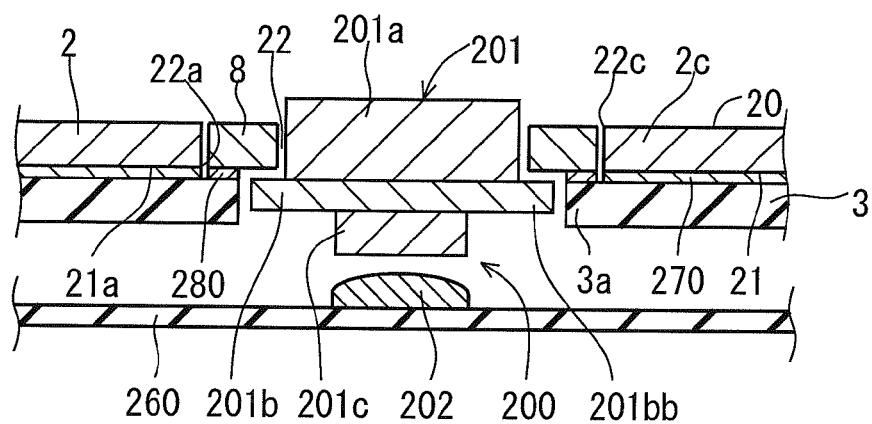
FIG. 14 is a view illustrating an example of the cross-sectional structure on the periphery of the operation button in the electronic apparatus.
Figure 15:
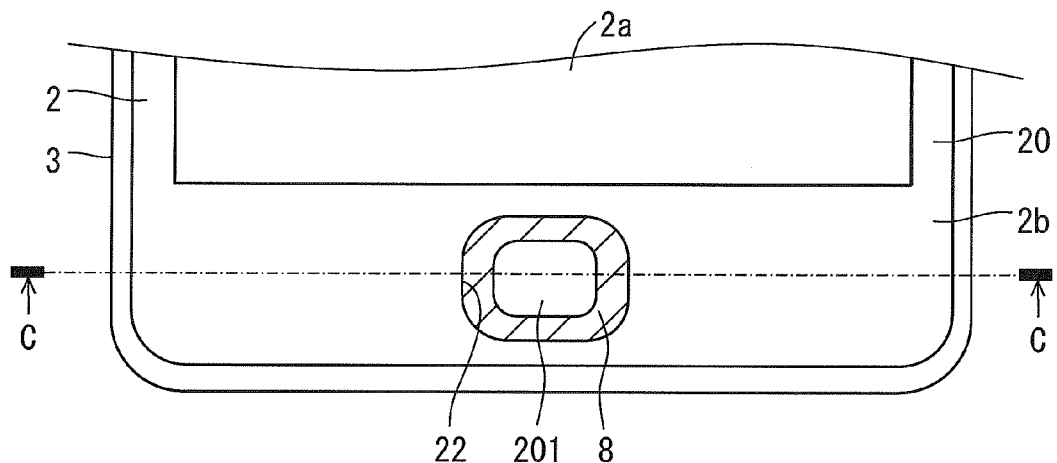
FIG. 15 is a front view illustrating an example of the operation button by enlarging the periphery thereof in the electronic apparatus.

In the second modified example, as illustrated in FIGS. 14 and 15, a panel 8 surrounds the operation button 201 when seen from the outer surface 20 side of the cover panel 2 in a plan view, and is inserted into the hole 22. FIG. 15 is an enlarged portion of a front view illustrating the electronic apparatus 1 according to the second modified example. FIG. 14 is a view illustrating the cross-sectional view taken along a line C-C of the electronic apparatus 1 of FIG. 15. In FIG. 15, the panel 8 is indicated by oblique lines.

As illustrated in FIG. 15, the panel 8 has a ring shape, is disposed in the hole 22, and surrounds the operation button 201. As illustrated in FIG. 14, the panel 8 is attached to a portion 3a by an attaching member 280. The portion 3a covers the inner peripheral edge 22b (see FIG. 14) of the hole 22 in the case 3. Therefore, the panel 8 covers the portion 3a in the case 3. The attaching member 280 may be, for example, a double-sided tape or an adhesive. The panel 8 also covers the peripheral end 201bb of the connecting portion 201b of the operation button 201.

In this manner, in the electronic apparatus 1 according to the second modified example, the panel 8 that surrounds the operation button 201, when seen from the outer surface 20 side of the cover panel 2 in a plan view, is inserted into the hole 22. Accordingly, The portion 3a covering the inner peripheral edge 22b of the hole 22 in the case 3 is covered by the panel 8.

The panel 8 may be made of materials other than sapphire (for example, a resin). In addition, the front surface (exposed surface) of the panel 8 may have alternate shapes.

Third Modified Example

Figure 16:
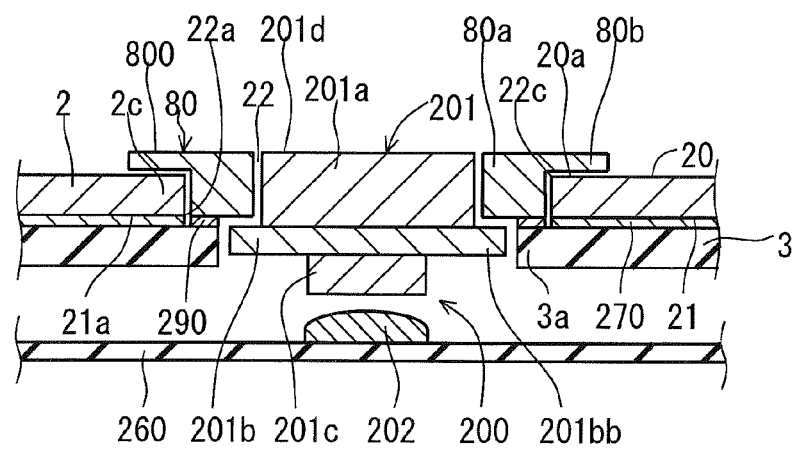
FIG. 16 is a view illustrating an example of the cross-sectional structure on the periphery of the operation button in the electronic apparatus.
Figure 17:
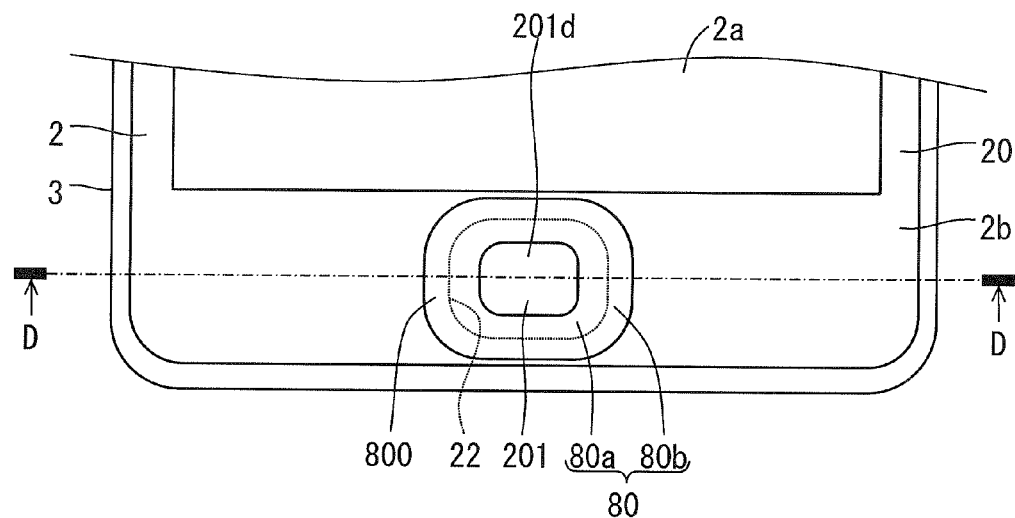
FIG. 17 is a front view illustrating an example of the operation button by enlarging the periphery thereof in the electronic apparatus.

In the third modified example, as illustrated in FIGS. 16 and 17, a panel 80 that surrounds the operation button 201 when seen from the outer surface 20 side of the cover panel 2 in a plan view, covers the edge 22c of the hole 22 in the outer surface 20, and is inserted into the hole 22. FIG. 17 is an enlarged portion of a front view illustrating the electronic apparatus. FIG. 16 is a view illustrating the cross-sectional structure taken along a line D-D of the electronic apparatus 1 of FIG. 17.

As illustrated in FIGS. 16 and 17, the panel 80 includes an inserted portion 80a that is inserted into the hole 22 and has a ring shape, and a flange portion 80b connected to the inserted portion 80a. The inserted portion 80a is disposed in the hole 22. The inserted portion 80a surrounds the operation object portion 201a of the operation button 201. The inserted portion 80a is attached to the portion 3a covering the inner peripheral edge 22b of the hole 22 (see FIG. 14) in the case 3 by the attaching member 290, as illustrated in FIG. 16. Therefore, the inserted portion 80a covers the portion 3a in the case 3. Attaching member 290 may be, for example, a double-sided tape or an adhesive. In addition, the inserted portion 80a covers the peripheral end 201bb of the connecting portion 201b of the operation button 201.

The flange portion 80b, extending from the ring-shaped inserted portion 80a, covers the portion 20a in the periphery of the hole 22 in the outer surface 20 of the cover panel 2. Therefore, the flange portion 80b covers the entire area of the edge 22c of the hole 22 in the outer surface 20 of the cover panel 2. A front surface 800 of the panel 80, and a front surface 201d of the operation button 201 are positioned on the same plane.

Further, since the panel 80 covers the edge 22c of the hole 22 in the outer surface 20 of the cover panel 2, the edge 22c is more difficult to chip. In addition, even when a burr is generated on the inner wall surface surrounding the hole 22, the burr is covered by the panel 80.

In addition, the panel 80 may be made of materials other than sapphire (for example, a resin).

The panel 80 also may have alternate shapes of the front surface 800.

Fourth Modified Example

In the above-described example, the portion 2c in the periphery of the hole 22 in the cover panel 2 is supported by the case 3. However, the portion 2c in the periphery of the hole 22 may be supported by a member different from the case 3.

Figure 18:
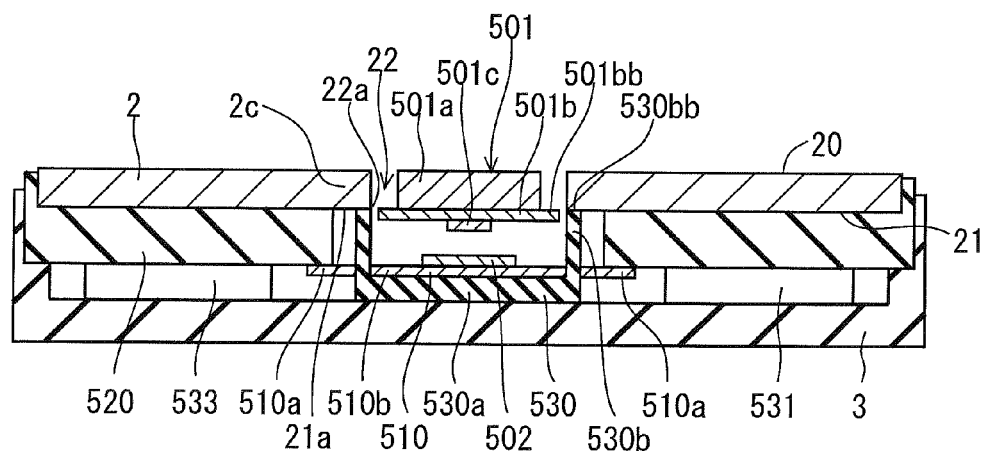
FIG. 18 is a view illustrating an example of the cross-sectional structure on the periphery of the operation button in the electronic apparatus.

FIG. 18 is a view illustrating the cross-sectional structure of the electronic apparatus 1 according to the fourth modified example. FIG. 18 illustrates the cross-sectional structure of the electronic apparatus 1 taken along a line corresponding to the line B-B illustrated in FIG. 2.

In the fourth modified example, an operation button 501 is provided instead of the operation button 201, and a switch 502 is provided instead of the switch 202. Since the operation button 501 is provided so as to face the switch 502, the switch 502 is turned on when the operation button 501 is operated (pressed). The shape of the hole 22 provided in the cover panel 2 is circular.

The operation button 501 includes an operation object portion 501a that is operated (pressed) by the user, a pressing portion 501c that presses the switch 502, and a connecting portion 501b connecting the operation object portion 501a with pressing portion 501c that presses the switch 502. A peripheral end 501bb of the connecting portion 501b is a flange and projects further outward than the operation object portion 501a and the pressing portion 501c. When the operation object portion 501a is pressed by the user, the pressing portion 501c presses the switch 502. Consequently, the switch 502 is turned on.

The switch 502 is mounted on a switch supporting member 510 that supports the switch 502. The switch supporting member 510 is mounted on a fixing member 520 for fixing the switch supporting member 510 to the cover panel 2. The fixing member 520 is attached to the inner surface 21 of the cover panel 2 using an attaching member such as a double-sided tape or an adhesive. The peripheral portion 21a of the hole 22 in the inner surface 21 of the cover panel 2 is not covered by the fixing member 520. The switch supporting member 510 is formed of a metal or the like, and the fixing member 520 is formed of a resin or the like.

Moreover, in the fourth modified example, a supporting member 530 supporting the peripheral portion 2c of the hole 22 in the cover panel 2 from the inner surface 21 side is provided in the housing 3. That is, the supporting member 530 supporting the peripheral portion 21a of the hole 22 in the inner surface 21 of the cover panel 2 is provided in the housing 3. In the fourth modified example, the supporting member 530 supports the peripheral portion 21a of the hole 22 in the inner surface 21 and covers the edge 22a (specifically, entire area of the edge 22a) of the hole 22 in the inner surface 21 of the cover panel 2. The supporting member 530 is fixed to the housing 3 and, for example, is integrally formed with the switch supporting member 510. Further, in FIG. 18, component 531, 533 for filling the gap between the fixing member 520 and the housing 3 is illustrated.

Figure 19:
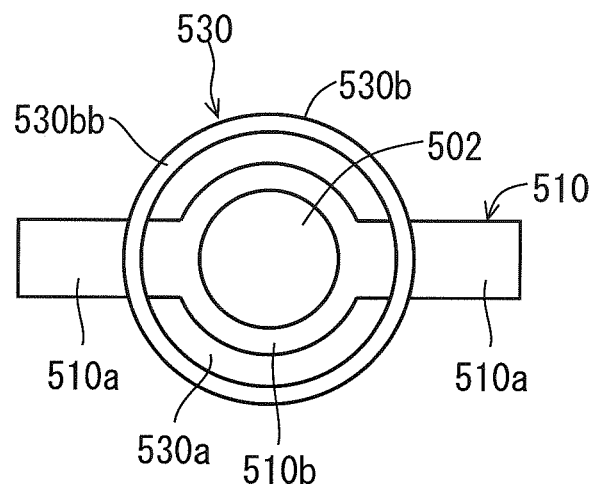
FIG. 19 is a plan view illustrating an example of a switch supporting component and a supporting component.
Figure 20:
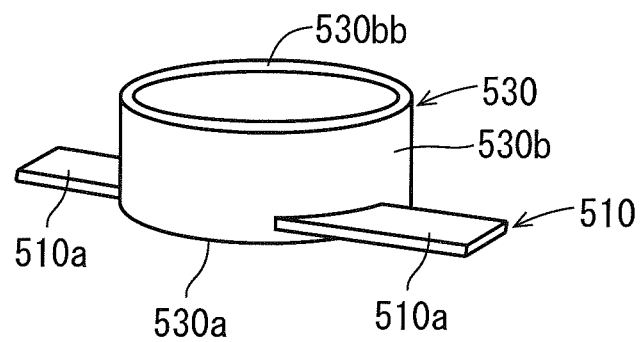
FIG. 20 is a perspective view illustrating an example of the switch supporting component and the supporting component.

FIG. 19 is a plan view in which the switch supporting member 510 and the supporting member 530 illustrated in FIG. 18 are seen from the hole 22 side of the cover panel 2. FIG. 20 is a perspective view illustrating the switch supporting member 510 and the supporting member 530.

As illustrated in FIGS. 19 and 20, the supporting member 530 has a hollow cylindrical shape whose bottom surface side is closed. The supporting member 530 includes a cylindrical bottom portion 530a and a cylindrical side wall portion 530b erected on the bottom portion 530a. In the supporting member 530, as illustrated in FIG. 18, an upper end surface 530bb of the side wall portion 530b supports the peripheral portion 21a of the hole 22 in the inner surface 21 of the cover panel 2.

The switch supporting member 510 has a plate shape. The switch supporting member 510 includes two mounting portions 510a for mounting the switch supporting member 510 on the fixing member 520, and a supporting portion 510b supporting the switch 502. Respective mounting portions 510a have a rectangular plate shape and the supporting portion 510b has a disk shape. Two mounting portions 510a extend from the peripheral edge of the supporting portion 510b to directions opposite to each other. The supporting portion 510b is disposed in the inside of the cylindrical side wall portion 530b of the supporting member 530, and is brought into contact with the upper surface of the bottom portion 530a of the supporting member 530. The respective mounting portions 510a extend to the outside from the inside of the side wall portion 530b, and penetrate into the side wall portion 530b of the supporting member 530 as illustrated in FIG. 20.

In this manner, in the fourth example, since the supporting member 530 supports the peripheral portion 21a of the hole 22 in the inner surface 21, and covers the edge 22a of the hole 22 in the inner surface 21 of the cover panel 2, the deformation and breakage of the peripheral portion 2c of the hole 22 in the cover panel 2 is reduced.

As illustrated in FIG. 18, since the fixing member 520 mounted on the inner surface 21 of the cover panel 2, and the component 531, 533 for filling the gap between the fixing member 520 and the housing 3 are provided, the cover panel 2 is difficult to bend when a force is applied to the outer surface 20 of the cover panel 2.

Figure 21:
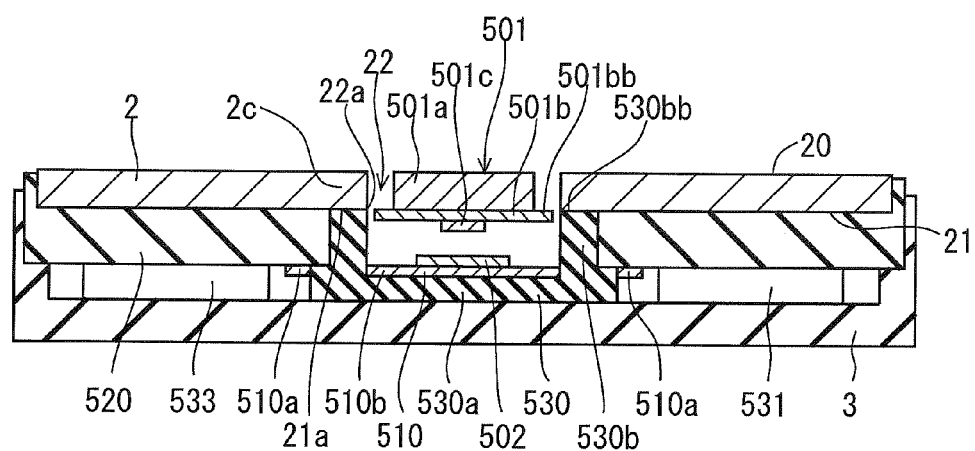
FIG. 21 is a view illustrating an example of the cross-sectional structure on the periphery of the operation button in the electronic apparatus.

The supporting member 530 may support the fixing member 520 as illustrated in FIG. 21. In the supporting member 530 illustrated in FIG. 21, the thickness of the side wall portion 530b is greater than that of the supporting member 530 illustrated in FIG. 18. In the side wall portion 530b of the supporting member 530, the thickness of the lower end is greater than other portions of the side wall portion 530b, and the lower end supports the fixing member 520.

Figure 22:
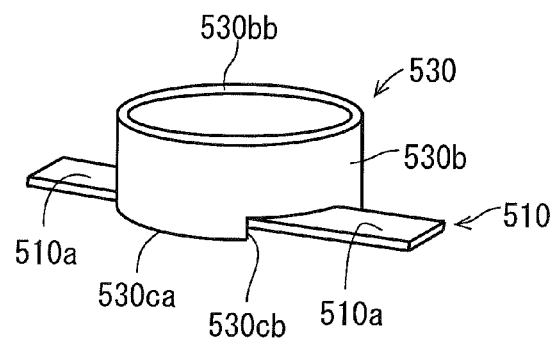
FIG. 22 is a plan view illustrating an example of the switch supporting component and the supporting component.
Figure 23:
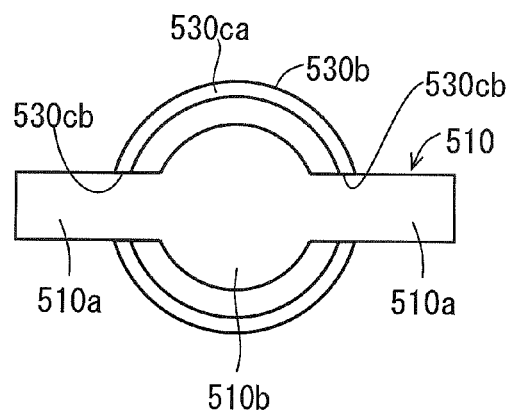
FIG. 23 is a perspective view illustrating an example of the switch supporting component and the supporting component.

Moreover, in the examples of FIGS. 18 and 21, the switch supporting member 510 is disposed and penetrates into the side wall portion 530b of the supporting member 530. However, the configuration of the switch supporting member 510 is not limited thereto. For example, as illustrated in FIGS. 22 and 23, the supporting member 530 may be formed in a cylindrical shape having a pair of concave portions 530cb. The pair of concave portions 530cb faces each other with respect to a lower end surface 530ca of the side wall portion 530b. Two mounting portions 510a of the switch supporting member 510 are respectively fitted in the pair of concave portions 530cb. FIG. 23 is a plan view illustrating the state of the structure illustrated in FIG. 22 when seen from the lower end surface 530ca.

Fifth Modified Example

Figure 24:
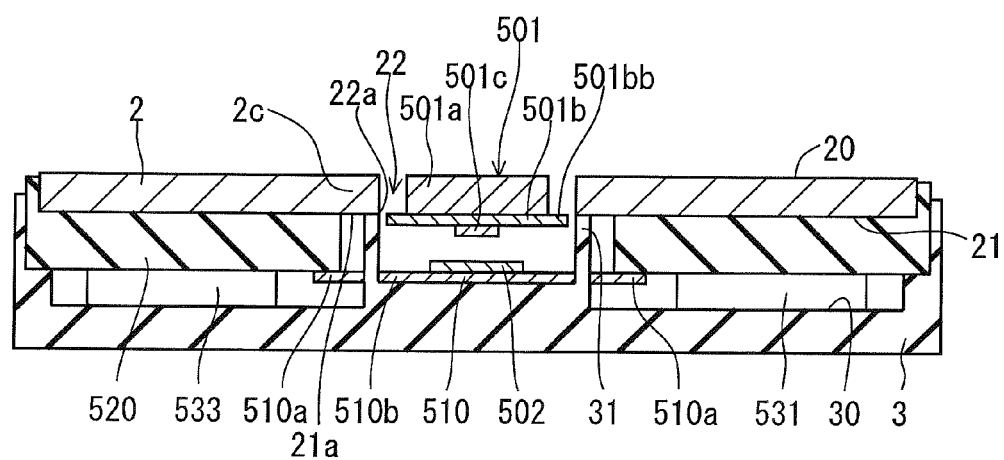
FIG. 24 is a view illustrating an example of the cross-sectional structure on the periphery of the operation button in the electronic apparatus.

In the above-described example illustrated in FIG. 18, the supporting member 530 supports the peripheral portion 21a of the hole 22 in the inner surface 21 of the cover panel 2. However, the housing 3 may support the portion 21a as illustrated in FIG. 24. In the example of FIG. 24, a cylindrical supporting structure 31 is provided in the inner bottom surface 30 of the housing 3 and the supporting structure 31 supports the portion 21a.

Figure 25:
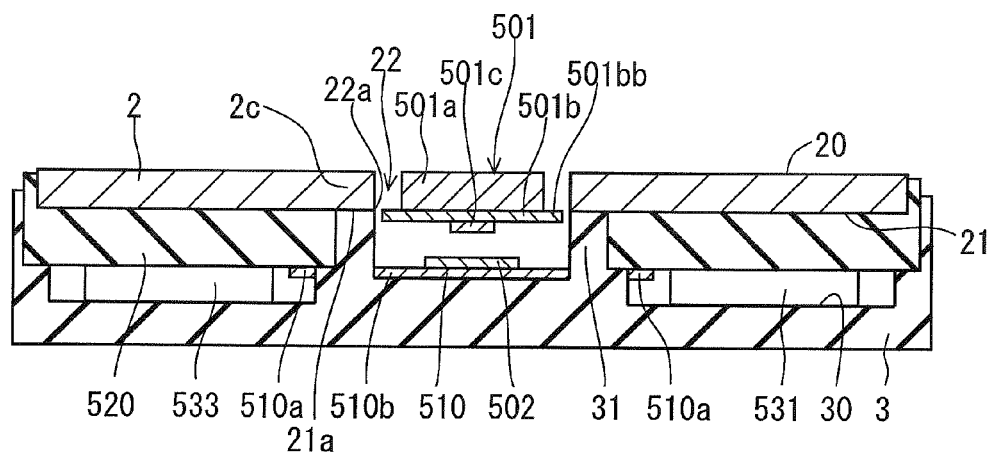
FIG. 25 is a view illustrating an example of the cross-sectional structure on the periphery of the operation button in the electronic apparatus.

The supporting structure 31 of the housing 3 may support the fixing member 520 as well as the cover panel 2 as illustrated in FIG. 25. In the supporting structure 31 illustrated in FIG. 25, the thickness thereof is greater than that of the supporting structure 31 illustrated in FIG. 24. Further, in the supporting structure 31, the thickness of the lower end is greater than other portions, and the lower end supports the fixing member 520.

Sixth Modified Example

Figure 26:
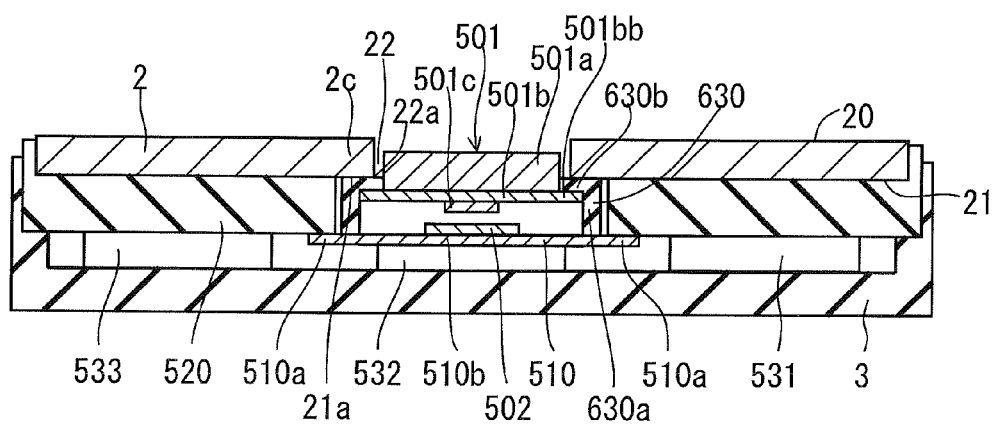
FIG. 26 is a view illustrating an example of the cross-sectional structure on the periphery of the operation button in the electronic apparatus.

In the above-described example illustrated in FIG. 18, the supporting member supporting the peripheral portion 21a of the hole 22 in the inner surface 21 of the cover panel 2 is fixed to the housing 3. However, the supporting member may be fixed to the switch supporting member 510. FIG. 26 is a view illustrating the cross-sectional structure of the electronic apparatus 1 according to the sixth modified example. FIG. 26 illustrates the cross-sectional structure of the electronic apparatus 1 taken along a line corresponding to the line B-B illustrated in FIG. 2 described above.

As illustrated in FIG. 26, in the sixth modified example, a supporting member 630 supporting the peripheral portion 21a of the hole 22 in the inner surface 21 of the cover panel 2 is provided in the housing 3. The supporting member 630 supports the peripheral portion 21a of the hole 22 in the inner surface 21 and covers the edge 22a (specifically, the entire area of the edge 22a) of the hole 22 in the inner surface 21 of the cover panel 2.

The supporting member 630 is mounted on the switch supporting member 510. Specifically, the supporting member 630 is mounted on the upper surface of the mounting portion 510a of the switch supporting member 510. Further, as illustrated in FIG. 26, components 531, 532 and 533 are provided in the housing 3.

Figure 27:
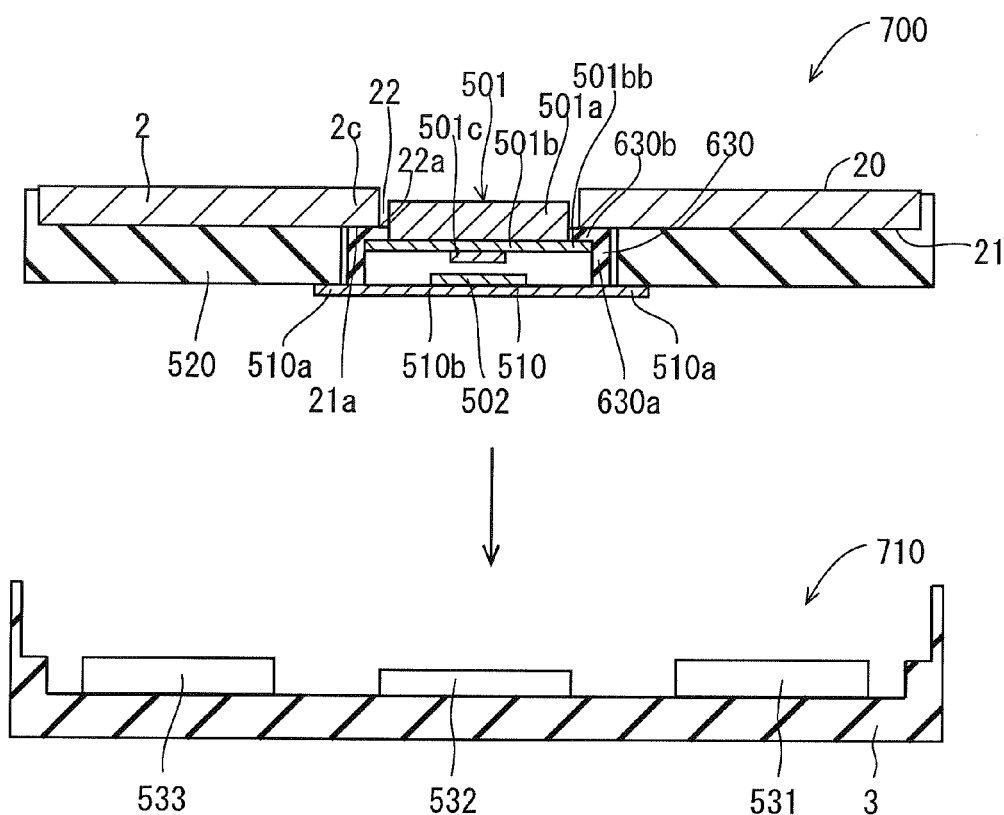
FIG. 27 is a view illustrating an example of a panel side assembly and a housing side assembly.

When the electronic apparatus 1 according to the sixth modified example is produced, a panel side assembly 700 and a housing side assembly 710 are separately produced as illustrated in FIG. 27. The panel side assembly 700 is mounted on the housing side assembly 710.

Figure 28:
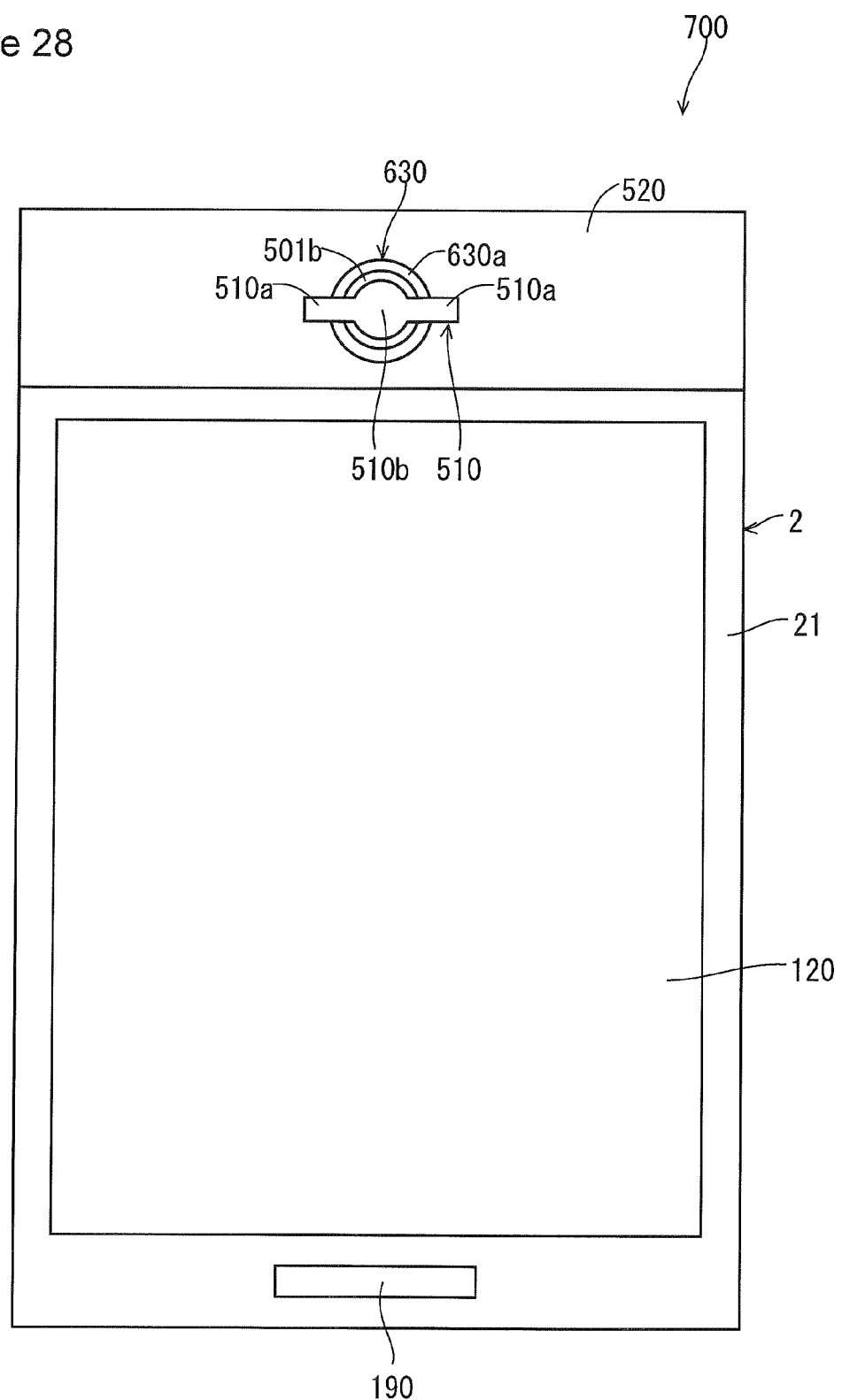
FIG. 28 is a plan view illustrating an example of the panel side assembly.

FIG. 28 is a plan view illustrating the assembly 700 on the panel side illustrated in FIG. 27 when seen from the switch supporting member 510. As illustrated in FIGS. 27 and 28, the panel side assembly 700 includes a touch panel 130 (see FIGS. 4 and 6), the cover panel 2 on which the display panel 120, the piezoelectric vibrating element 190, and the like are mounted, the operation button 501, the switch 502, the switch supporting member 510, the fixing member 520, and the supporting member 630. The housing side assembly 710 includes the housing 3 and plural components and the like fixed to the housing 3 such as the components 532-533.

Figure 29:
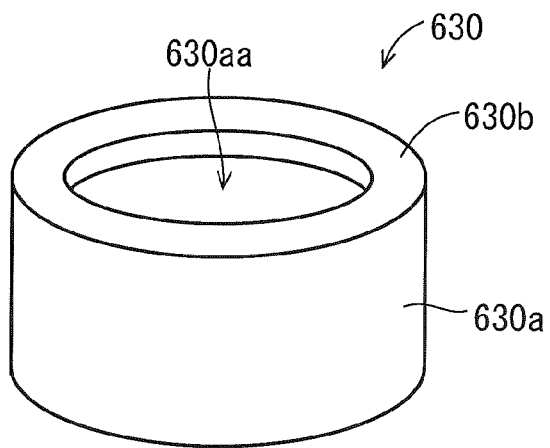
FIG. 29 is a perspective view illustrating an example of the supporting component.
Figure 30:
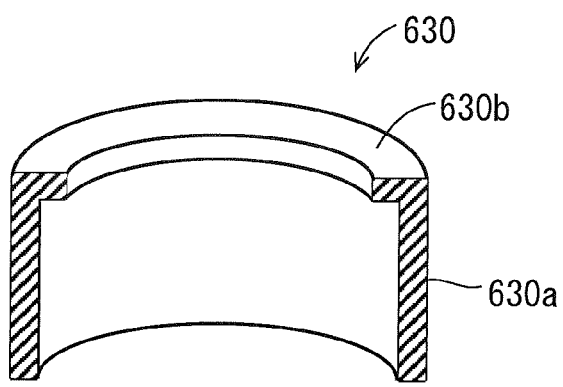
FIG. 30 is a view illustrating an example of a cross-sectional structure of the supporting component.

FIG. 29 is a perspective view illustrating the structure of the supporting member 630. FIG. 30 is a perspective view illustrating the cross-sectional structure of the supporting member 630 in the vertical direction of FIG. 29. As illustrated in FIGS. 26 to 30, the supporting member 630 includes a fixed portion 630a to be fixed to the switch supporting member 510, and a supporting portion 630b supporting the peripheral portion 21a of the hole 22 in the inner surface 21 of the cover panel 2. The fixed portion 630a has a cylindrical shape, and the supporting portion 630b has a hollow cylindrical shape. The supporting portion 630b is provided on the upper end of the fixed portion 630a and covers the peripheral end of an upper opening 630aa of the cylindrical fixed portion 630a (see FIG. 31).

In the sixth modified example, the flange-like peripheral end 501bb of the operation button 501 extends from the lower side of the hole 22 of the cover panel 2 to the lower side of the peripheral portion 2c of the hole 22 in the cover panel 2. Accordingly, the flange-like peripheral end 501bb of the operation button 501 faces the peripheral portion 2c of the hole 22 in the cover panel 2. The supporting portion 630b of the supporting member 630 that supports the peripheral portion 21a of the hole 22 in the inner surface 21 of the cover panel 2 extends from the lower side of the portion 21a to the lower side of the hole 22. The peripheral end 501bb of the operation button 501 is covered by the supporting portion 630b. Therefore, the supporting portion 630b of the supporting member 630 is positioned between the peripheral portion 2c of the hole 22 and the flange-like peripheral end 501bb of the operation button 501 in the cover panel 2.

In this manner, in the sixth modified example, since the supporting portion supporting the peripheral portion 21a of the hole 22 in the inner surface 21 covers the edge 22a of the hole 22 in the inner surface 21 of the cover panel 2, the deformation and breakage of the peripheral portion 2c of the hole 22 in the cover panel 2 is reduced.

Further, in the sixth modified example, since the supporting member 630 supporting the peripheral portion 2c of the hole 22 in the cover panel 2 is supported by the switch supporting member 510 mounted on the fixing member 520, the deformation of the peripheral portion 2c of the hole 22 in the cover panel 2 is more reduced. Therefore, the breakage of the cover panel 2 is reduced.

As illustrated in FIG. 26, since the fixing member 520 mounted on the inner surface 21 of the cover panel 2 and the component 530 for filling the gap between the fixing member 520 and the housing 3 are assembled, the cover panel 2 is difficult to be bent. Therefore, the breakage of the cover panel is reduced.

Similarly, since the fixing member 520 mounted on the inner surface 21 of the cover panel 2 and the component (3) 531, 533 for filling the gap between the fixing member 520 and the housing 3 are provided, the cover panel 2 is difficult to bend. Therefore, the breakage of the cover panel 2 is reduced.

In addition, as illustrated in FIG. 26, since the component 532 for filling the gap between the switch supporting member 510 and the housing 3 is provided, the peripheral portion 2c of the hole 22 in the cover panel 2 is supported by the supporting member 630.

Figure 31:
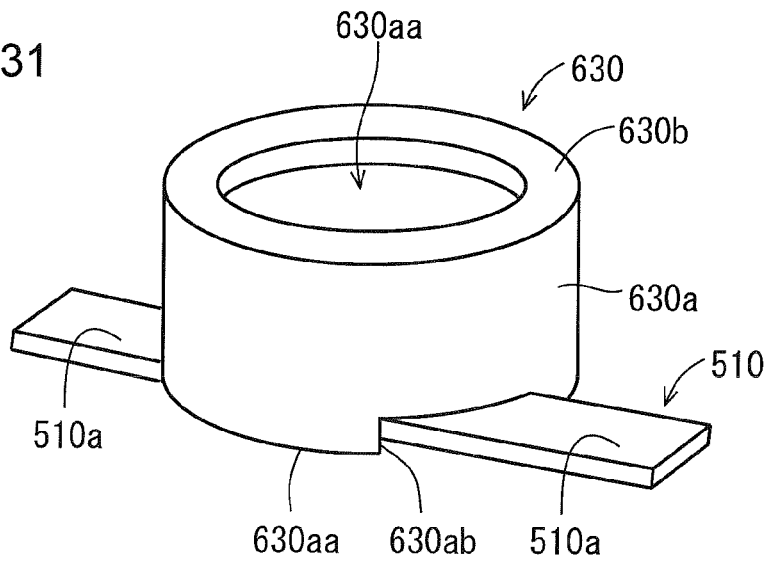
FIG. 31 is a plan view illustrating an example of the switch supporting component and the supporting component.

As illustrated in FIG. 31, similarly to the above-described examples of FIGS. 22 and 23, a pair of concave portions 630ab facing each other with respect to the lower end surface 630aa of the cylindrical fixed portion 630a of the supporting member 630 may be provided. Two mounting portions 510a of the switch supporting member 510 may be fitted in the pair of concave portions 630ab.

Other Modified Examples

In the electronic apparatus 1 according to the above-described fourth to sixth modified examples, similarly to the above-described panel 8 illustrated in FIG. 14 and FIG. 15, or the above-described panel 80 illustrated in FIG. 16 and FIG. 17, a panel surrounds the operation button 501 when seen from the outer surface 20 side of the cover panel 2, and is inserted into the hole 22.

In the above-described examples, the present invention is applied to a mobile phone, but the above described examples can be applied to an electronic apparatus other than a mobile phone such as a smart phone, a tablet terminal and a wearable type electronic apparatus mounting on an arm, digital books, digital cameras, electronic game machines, digital music players, personal digital assistance (PDA), personal handy phone system (PHS), lap top computers, portable TV's, Global Positioning Systems (GPS's) or navigation systems, machining tools, pedometers, health equipments such as weight scales, display monitors, wristwatch, and the like. As described above, the electronic apparatus 1 has been described in detail, but the above description is merely an example in every aspect and the present invention is not particularly limited thereto. Further, various modifications described above can be applied in combination as long as they do not contradict each other. In addition, it is understood that numerous modified examples which are not exemplified above can be assumed without departing from the scope of the invention.

What is claimed is:

1. An electronic apparatus, comprising:
a housing;
a first panel made of sapphire that is disposed on the housing, the first panel comprising:
a first surface facing outwards from the housing;
a second surface on the opposite side to the first surface; and
a through-hole extending through the first panel, the first surface and the second surface having a peripheral edge surrounding the through-hole;

an operation button that is positioned in the through-hole; and a supporting structure that supports the second surface of the first panel, and supports and covers the peripheral edge on the second surface, the operation button is positioned in a cylindrical supporting member, the cylindrical supporting member includes a top surface that supports the peripheral edge of the through-hole of on the second surface of the first panel;

a switch that faces the operation button;

a switch supporting member that supports the switch and the cylindrical supporting member;

a fixing member for fixing the switch supporting member to the first panel; and a component for filling a gap between the switch supporting member and the housing.

2. The electronic apparatus according to claim 1, wherein the supporting structure comprises a portion of the housing that extends to the through-hole and supports the peripheral edge on the second surface of the first panel.

3. The electronic apparatus according to claim 1, wherein the operation button comprises a connecting portion positioned between the operation button and a switch pressing portion, wherein the connecting portion extends out from the operation button.

4. The electronic apparatus according to claim 1, further comprising a second panel that surrounds the operation button when seen from the first surface of the first panel in a plan view and is inserted into the through-hole between the operation button and the peripheral edge.

5. The electronic apparatus according to claim 4, wherein the second panel comprises a second panel flange portion that extends outward from the through-hole to cover the peripheral edge of the first surface of the first panel.

6. The electronic apparatus of claim 1, further comprising a fixing member that is positioned between the first panel and the switch supporting member, the fixing member fixing the first panel to the housing.

7. The electronic apparatus of claim 1, wherein the switch supporting member extends outward from opposing sidewalls of the cylindrical supporting member.

8. The electronic apparatus of claim 1, wherein the cylindrical supporting member is provided in an inner bottom surface of the housing.

9. The electronic apparatus of claim 8, further comprising a fixing member positioned between the first panel second surface and the inner bottom surface of the housing, wherein the cylindrical supporting member further supports the fixing member.

10. The election apparatus of claim 1, wherein the cylindrical supporting member top surface comprises a supporting portion that extends inward into the through-hole.

* * * * *